US006952036B2

(12) United States Patent (10) Patent No.: US 6,952,036 B2
Suzuki et al. (45) Date of Patent: Oct. 4, 2005

(54) THIN-FILM TRANSISTOR STRUCTURE, METHOD FOR MANUFACTURING THE THIN-FILM TRANSISTOR STRUCTURE, AND DISPLAY DEVICE USING THE THIN-FILM TRANSISTOR STRUCTURE

(75) Inventors: Hiroshi Suzuki, Yamato (JP); Kuniaki Sueoka, Sagamihara (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/468,431

(22) PCT Filed: Dec. 18, 2001

(86) PCT No.: PCT/JP01/11110

§ 371 (c)(1),
(2), (4) Date: Jan. 16, 2004

(87) PCT Pub. No.: WO02/067335

PCT Pub. Date: Aug. 29, 2002

(65) Prior Publication Data

US 2004/0113161 A1 Jun. 17, 2004

(30) Foreign Application Priority Data

Feb. 19, 2001 (JP) .......................................... 2001-042081

(51) Int. Cl.[7] ........................................... H01L 23/535
(52) U.S. Cl. ........................ 257/347; 257/759; 257/642
(58) Field of Search ................................. 257/347, 642, 257/759; 438/623, 725, 780, 149, 479, 517

(56) References Cited

U.S. PATENT DOCUMENTS

| 5,530,293 A | * | 6/1996 | Cohen et al. ................ 257/752 |
| 5,912,492 A | * | 6/1999 | Chang et al. ................ 257/344 |
| 6,111,280 A | * | 8/2000 | Gardner et al. ............. 257/253 |
| 6,235,563 B1 | * | 5/2001 | Oka et al. .................... 438/166 |
| 6,455,934 B1 | * | 9/2002 | Pasch .......................... 257/753 |
| 6,501,098 B2 | * | 12/2002 | Yamazaki ..................... 257/72 |

FOREIGN PATENT DOCUMENTS

| JP | 06107881 A | * | 4/1994 | ........... C08L/25/02 |
| JP | 06177126 A2 | | 6/1994 | |
| JP | 10268522 A2 | | 10/1998 | |
| JP | 11231335 A2 | | 8/1999 | |
| JP | 11339672 A2 | | 12/1999 | |
| WO | WO0076975 A1 | | 12/1920 | |
| WO | WO02067335 A1 | | 8/2002 | |

* cited by examiner

Primary Examiner—Tom Thomas
Assistant Examiner—Eugene Lee
(74) Attorney, Agent, or Firm—Ira D. Blecker

(57) ABSTRACT

The present invention provides a thin film transistor structure in which at least a trench is formed in an insulating polymer film formed on a substrate. In the thin film transistor structure, a trench formed in the insulating polymer film accommodates a gate wiring constituted of a plurality of conductive layers. Provided also are a method of manufacturing the thin film transistor structure, and a display device including a thin film transistor array composed of the thin film transistors constituted as described above.

13 Claims, 11 Drawing Sheets

(a)

(b)

(a) CONSTANT WIRING CROSS SECTION (S1 = S2) (b)

FLOATING CAPACITANCE ~Lb / La

FIG. 1
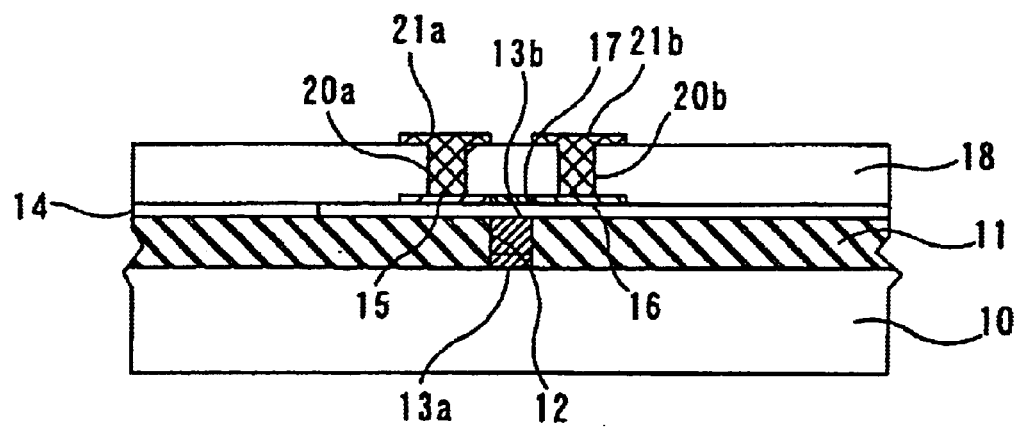
(a)
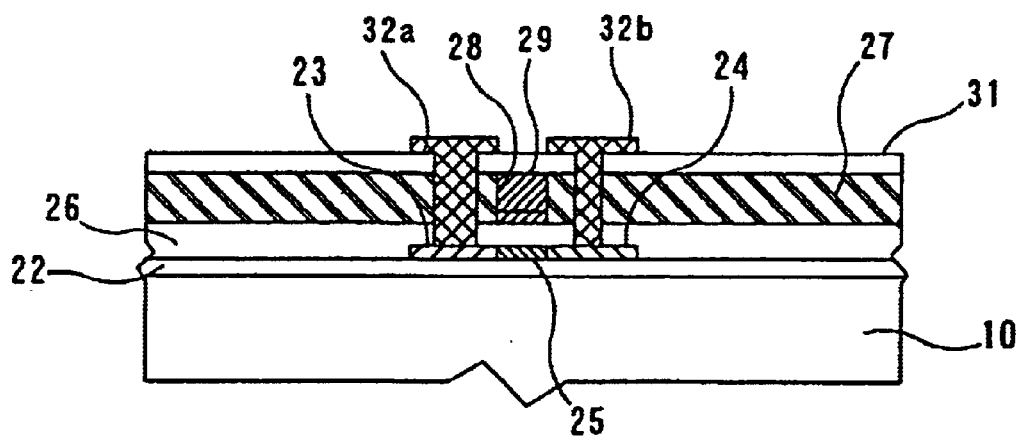
(b)

FIG. 2
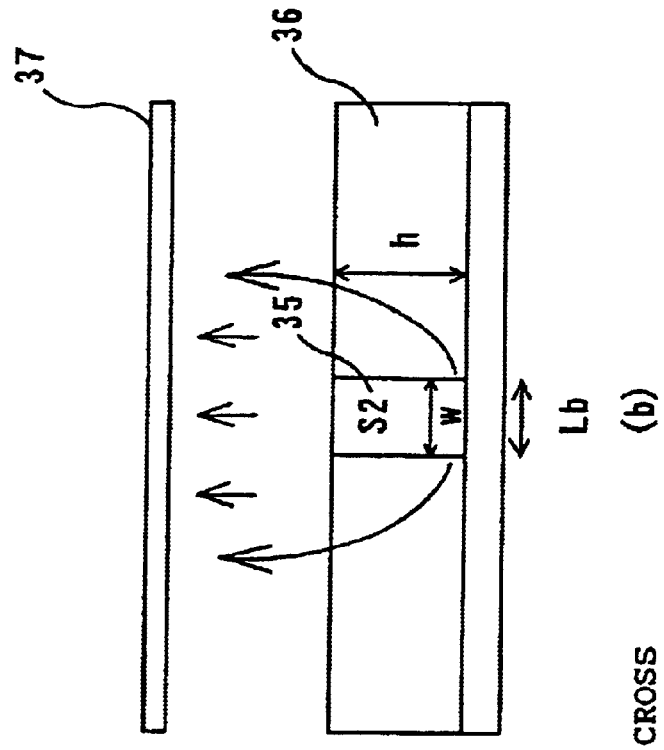
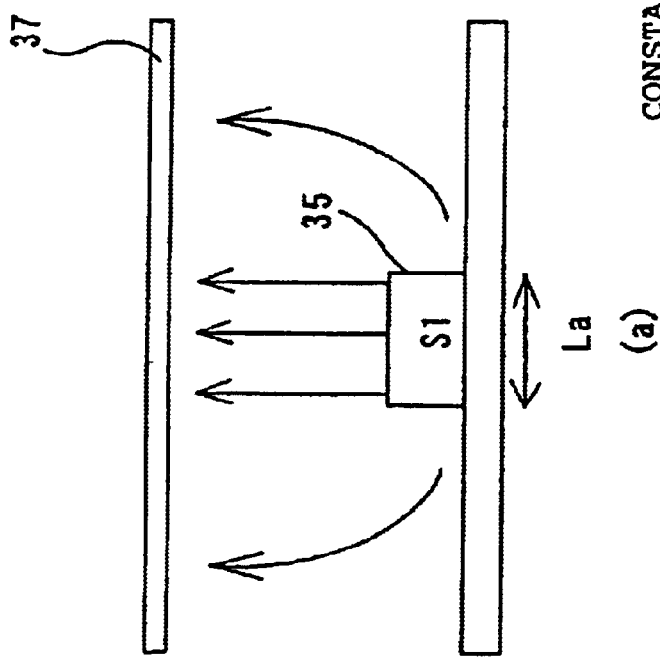

FIG. 5
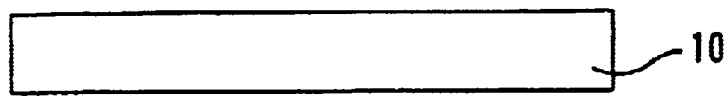
(a)
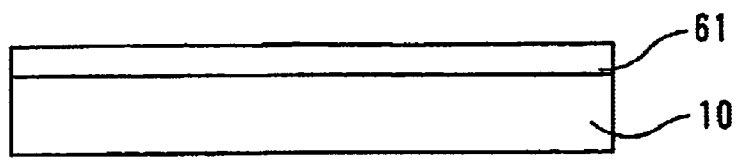
(b)
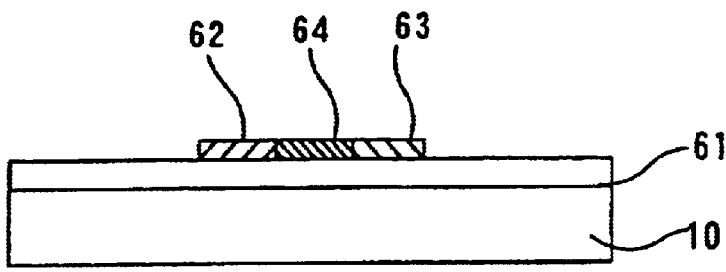
(c)
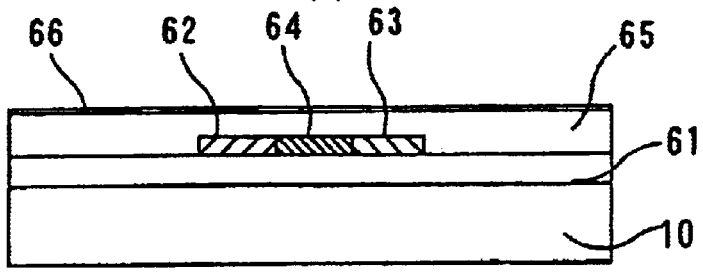
(d)
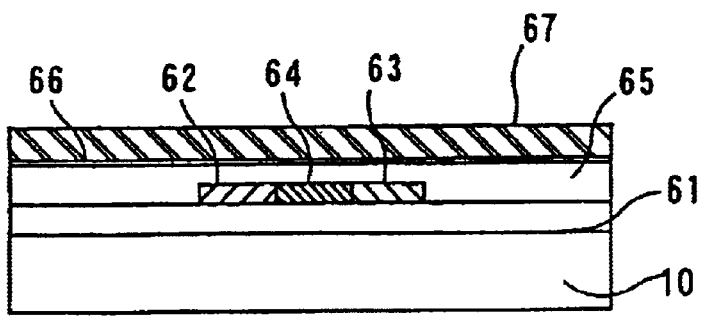
(e)

FIG. 8
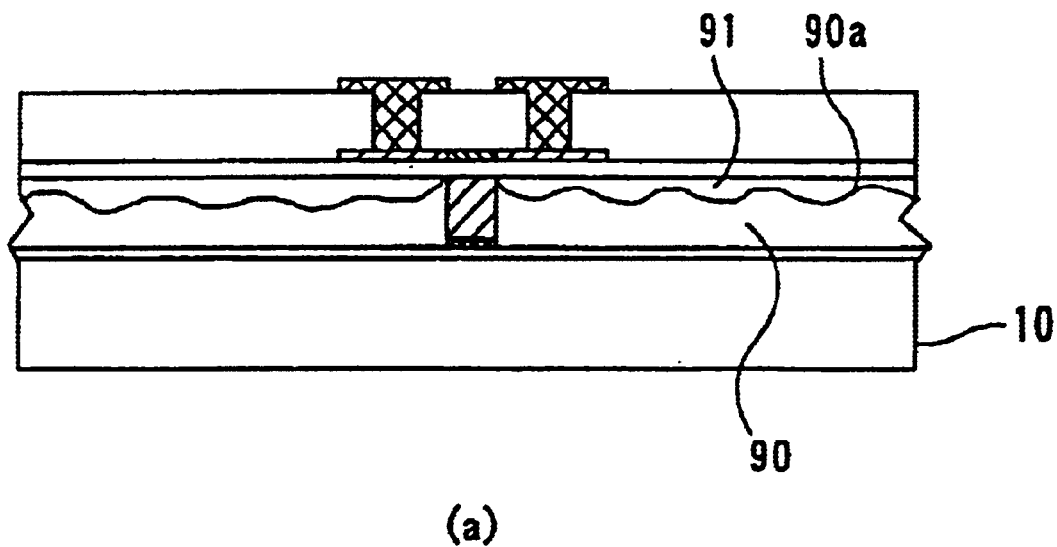
(a)
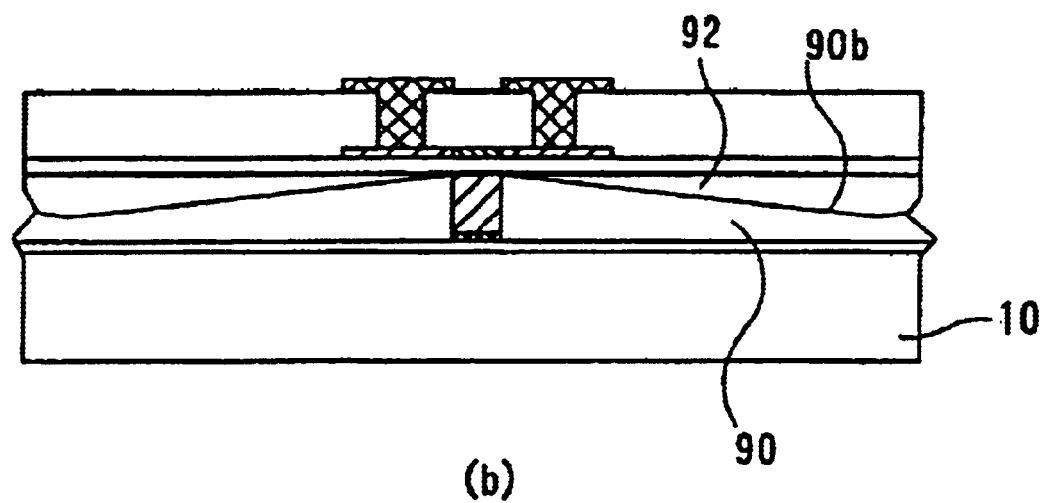
(b)

THIN-FILM TRANSISTOR STRUCTURE, METHOD FOR MANUFACTURING THE THIN-FILM TRANSISTOR STRUCTURE, AND DISPLAY DEVICE USING THE THIN-FILM TRANSISTOR STRUCTURE

This application claims priority from PCT International Application No. PCT/JP01/11110, filed 18 Dec. 2001, designating the United States and prior foreign application Japanese Patent Application No. 2001-42081 filed 19 Feb. 2001 in Japan.

BACKGROUND OF THE INVENTION

The present invention relates to a thin film transistor structure, a method of manufacturing the same and a display device including the same, more particularly to a thin film transistor capable of realizing a high definition display without causing a signal delay and providing a large display screen by making a gate wiring which is connected to the thin film transistor have a large cross sectional area while reducing floating capacitance, a method of manufacturing the same, and a display device including the same.

A liquid crystal display using a thin film transistor (hereinafter referred to as a TFT) has been widely used as a display device in apparatuses such as computers, cellular telephones, watches and television sets to perform various displays. Particularly, a large screen and a high definition of a display device using the TFT have been demanded in recent years accompanied with increases in capability and storage capacitance of the computers and the like. To achieve the large screen and the high definition of the display device using the TFT, it is necessary to prevent a signal propagation delay by reducing resistivity particularly of a gate wiring. Therefore, lowering of resistivity of material forming the gate wiring has been investigated, and materials having low resistivity such as Al and Cu are starting to be adopted in stead of materials having relatively high resistivity such as Mo, MoW and MoTa.

However, when studying a 30-inch display device, in which the material of very low resistivity such as the foregoing Cu is used and also a definition is measured on diagonal lines thereof under a condition that a switching speed of the TFT is ignored, it turns out to be difficult to achieve a high definition of 200 ppi or higher with resistivity of the present gate wiring. This is because the definition of the display device depends on both resistivity of the material and a cross sectional area thereof even if material of low resistivity is used.

Specifically, to achieve the large screen and the high definition in the display device using the TFT, the cross sectional area of the gate wiring must be made large in addition to using the material with low resistivity. However, when a horizontal planar area of a gate electrode is expanded to increase the cross sectional area of the gate wiring, an aperture ratio of a pixel electrode is necessarily reduced, and additionally, a capacitor is formed between the gate wiring and other wirings or the gate electrode, thus producing floating capacitor. Accordingly, a transmission delay of signals may occur. Furthermore, though a thickness of the gate wiring can be simply increased, the mere increase in the thickness of the gate wiring causes another disadvantage that other wirings such as a signal wiring crossing the gate wiring are broken down.

Moreover, in terms of a manufacturing method of the gate wiring, the gate wiring is formed conventionally by a vapor deposition method such as a sputtering method. Although it is possible to increase the thickness of the gate wiring significantly since a film growth rate is low in the conventional vapor deposition method such as the sputtering method, this method may cause disadvantages in manufacturing such as a low yield and a high cost. Accordingly, the gate wiring must be manufactured by a more efficient method.

In order to scale down wirings formed on a substrate, various attempts have been made thus far. For example, in Japanese Patent Laid-Open No.10(1998)-268522, a method of forming a conductive pattern is disclosed, in which patterning is performed by use of a positive photoresist on a substrate, and the substrate is subjected to electroless plating thus forming the conductive pattern on an exposed substrate.

In Japanese Patent Laid-Open No. 11(1999)-339672, a method of manufacturing an image display device is disclosed, in which photoresist is coated on a substrate and patterning is performed, and then an electrode is formed by use of an electroplating method, an electroless plating method, or both the electroplating method and the electroless plating method, followed by removing of the photoresist.

In Japanese Patent Laid-Open No. 11(1999)-231335, a method of manufacturing a substrate with a buried electrode is disclosed, in which a silicon dioxide film deposited on the substrate is patterned, and an electrode is formed on the exposed substrate by use of an electroless plating method.

However, any of the methods described above have not been satisfactory in terms of achieving a large screen, a high definition, an improved manufacturing yield and a reduced manufacturing cost while minimizing a propagation delay of a display device including a TFT structure.

The present invention was made in consideration of the foregoing problems.

SUMMARY OF THE INVENTION

It is an object of the present invention to achieve a large screen and a high definition in a display device using a TFT at a low cost while solving problems regarding a propagation delay of a gate wiring and at the same time improving manufacturing yield.

According to the present invention, a TFT structure is provided, in which, on a substrate, formed are a source electrode, a drain electrode, a gate electrode, an active layer, a gate wiring connected to the gate electrode and an insulating polymer film in which at least a trench is formed, the trench formed in the insulating polymer film accommodating the gate wiring constituted of a conductive layer in a self-alignment therewith. In the present invention, a thickness of the gate wiring should be 2 micrometers to 15 micrometers, and an aspect ratio of the gate wiring should be 0.3 to 3. Moreover, in the present invention, the insulating polymer film may be subjected to a treatment for regulating an optical property thereof.

It is possible for a plurality of polymers to constitute the insulating polymer film in the present invention. Furthermore, in the present invention, the insulating polymer film may contain silicone-containing polymeric substance. In the present invention, the gate wiring can be constituted by the conductive layer forming a seed layer deposited by electroless plating and the conductive layer deposited by electroplating. In the present invention, the TFT may be a top gate type TFT or a bottom gate type TFT. In the present invention, the insulating polymer film may contain photosensitive resin or photosensitive resin composition.

According to the present invention, provided is a method of manufacturing a TFT structure in which, on a substrate, formed are a source electrode, a drain electrode, a gate electrode, an active layer, a gate wiring connected to the gate electrode, and an insulating polymer film in which at least a trench is formed, the method comprising the steps of: forming the source electrode, the drain electrode, the gate electrode, and the active layer; forming the insulating polymer film on the substrate; forming the trench by patterning the insulating polymer film; and depositing a conductive layer in the trench to form the gate wiring in self-alignment with the insulating polymer film.

According to the present invention, the gate wiring can be formed by a process for depositing the conductive layer forming a seed layer through electroless plating and by a process for depositing the conductive layer different from the seed layer through electroplating.

In the present invention, the process for forming the gate wiring may include a process for controlling a current amount and duration of the electroplating. In the present invention, the process for forming the gate wiring may include a process for forming the conductive layer different from the conductive layer forming the seed layer and a process for making a level of the conductive layer formed by the electroplating equal to that of the insulating polymer film. In the present invention, the process may include a process for subjecting the insulating polymer film to a treatment for regulating an optical property thereof. In the present invention, the insulating polymer film may contain silicone-containing polymeric substance. In the present invention, the insulating polymer film can be made of photosensitive resin or photosensitive resin composition.

According to the present invention, provided is a display device including a TFT structure in which, on a substrate, formed are a source electrode, a drain electrode, a gate electrode, an active layer, a gate wiring connected to the gate electrode and an insulating polymer film in which at least a trench is formed, the trench formed in the insulating polymer film accommodating the gate wiring constituted of a conductive layer in a self-alignment therewith. In the present invention, a thickness of the gate wiring can be set 2 micrometers to 15 micrometers, and an aspect ratio of the gate electrode can be set 0.3 to 3. According to the present invention, the insulating polymer film can be subjected to a treatment for regulating an optical property of the display device. According to the present invention, the insulating polymer film may contain photosenstive resin or photosenstive resin composition. According to the present invention, the insulating polymer film may contain silicone-containing polymeric substance.

BRIEF DESCRIPTION OF THE DRAWINGS

For a more complete understanding of the present invention and the advantages thereof, reference is now made to the following description taken in conjunction with the accompanying drawings.

FIGS. 1(a) and 1(b) are drawings showing a TFT structure of the present invention.

FIG. 2(a) is a drawing showing an operation of a conventional TFT structure, and FIG. 2(b) is a drawing showing an operation of a TFT structure of the present invention.

FIGS. 5(a) to 5(e) are drawings showing manufacturing steps of another embodiment of a method of manufacturing the TFT structure according to the present invention.

FIGS. 8(a) and 8(b) are drawings showing further still another embodiment of the TFT structure according to the present invention.

DETAILED DESCRIPTION OF THE PREFERRED EMBODIMENTS

Figure 3:
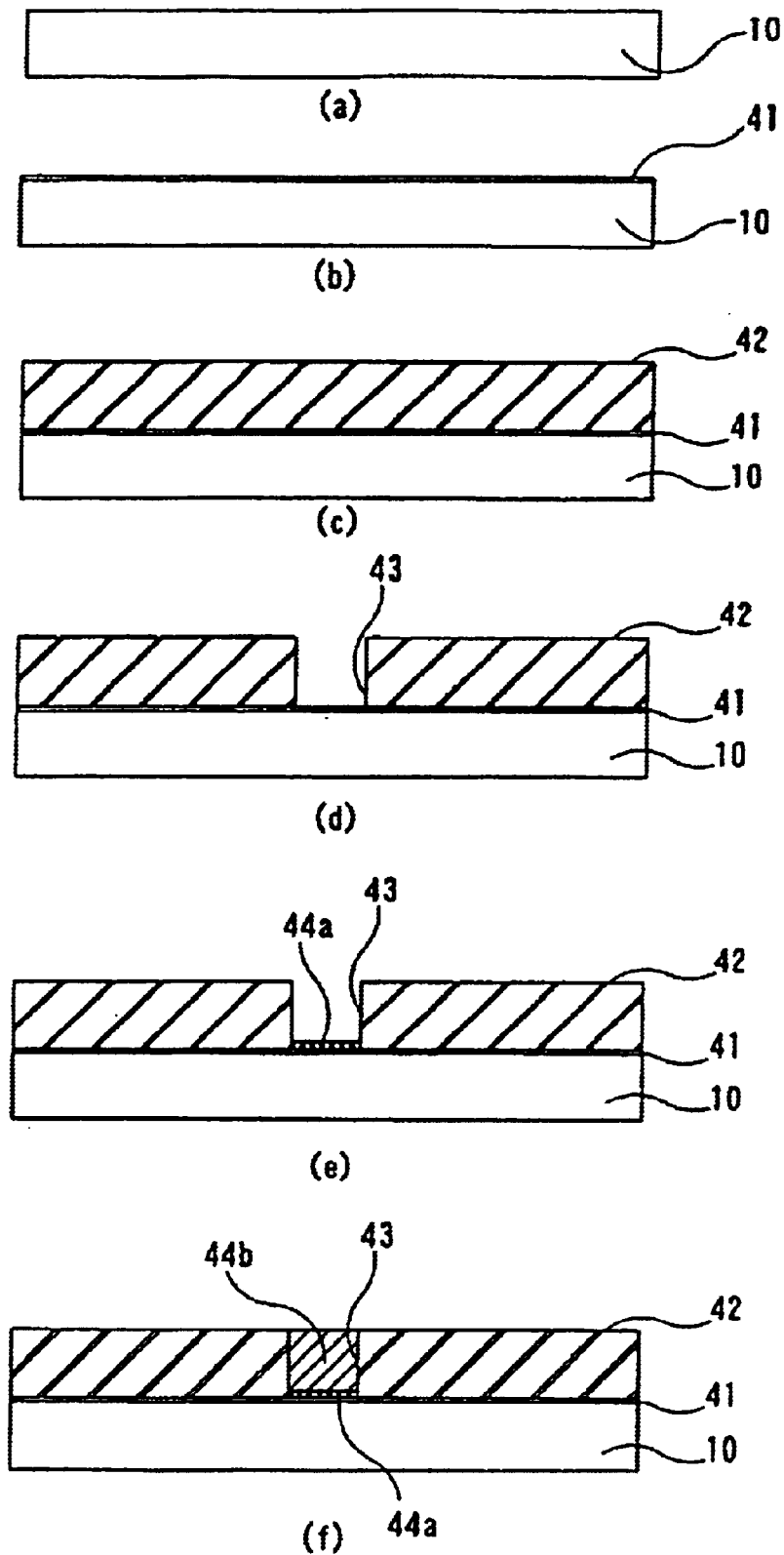
FIGS. 3(a) to 3(f) are drawings showing manufacturing steps of an embodiment of a method of manufacturing the TFT structure according to the present invention.

FIGS. 1(a) and 1(b) are drawings showing a TFT structure of the present invention. FIG. 1(a) shows a structure of a bottom gate type TFT, and FIG. 1(b) shows a structure of a top gate type TFT. In the TFT structure shown in FIG. 1(a), an insulating polymer film 11 is provided on a substrate 10 such as insulating glass and ceramics, and a gate wiring formed by a plurality of conductive layers 13a and 13b are buried in a trench 12 formed in the insulating polymer film 11. The insulating polymer film 11 that can be employed in the present invention may be constituted of any one of insulating polymer material and polymer composition.

As the polymer composition that can be used in the present invention, it is possible to enumerate, as specific examples, thermoplastic resin or thermosetting resin such as polyacrylate, polystyrene, polyacrylate styrene, polyester, epoxy resin, polycarbonate resin, polyamide resin and the like. The polymer material that can be used as the insulating polymer film 11 in the present invention can be made of either photosensitive resin composition or photosensitive resin, that is, polymer or polymer composition that can be used as so-called photoresist, which is obtained by mixing or chemically combining photosensitve components with acrylic polymer, acrylic-styrene polymer or epoxy polymer.

As the above-described photosensitive resin composition, it is possible to enumerate: positive photoresist obtained by mixing quinone-diazo derivative to acrylic resin and phenolnovolac resin; positive or negative photoresist of so-called chemical amplification type obtained by mixing optical acid generator to acrylic resin, one of acrylic-styrene copolymer and acrylic-hydroxy styrene copolymer, and acrylic-alkoxy styrene copolymer; negative photoresist obtained by mixing acrylic resin with acrylate (methacrylate) having ethylene non-saturated bond, the negative photoresist enabling photo-polymerization by diazo compound; and epoxy photoresist obtained by mixing cation polymerization initiator to epoxy resin.

In the present invention, however, the photosenstive resin composition is not limited to the foregoing polymer or the foregoing photoresist, and any polymer or polymer composition can be used as long as the polymer or polymer composition is capable of forming the trench 12 by use of an appropriate patterning process for the polymer material.

A thickness of the insulating polymer film 11 shown in FIG. 1(a) can be set in a range of 1 micrometer to 15 micrometers taking an electrical property such as an insulating property into consideration. Moreover, when it is considered that the gate wiring is formed in the trench 12 in the present invention, the thickness of the insulating polymer film 11 should be set in a range of 2 micrometers to 10 micrometers in consideration for easiness of formation of the trench 12, more preferably in a range of 2 micrometers to 5 micrometers to particularly achieve a high definition and a large screen in the present invention.

As shown in FIG. 1(a), the gate wiring is formed by laminating the conductive layers 13a and 13b. The conductive layer 13a is a seed layer made of a metal such as Ni, which is formed by an electroless plating method. The conductive layer 13b is formed by an electroplating method and is formed so as to contain material for making resistivity of the gate wiring low.

To achieve the high definition and the large screen in the present invention without causing a propagation delay of signals, it is preferable that the conductive layer 13b is formed by a metal with low resistivity such as Al, Cu and Ag. Moreover, from the viewpoint of stability of the conductive layer 13b in the present invention, the conductive layer 13b should be formed by Al or Cu.

Since the gate wiring is buried and formed in the insulating polymer film 11 in the present invention, a thickness of the gate wiring shown in FIG. 1(a) should be set to the same level as that of the insulating polymer film 11, and the thickness of the gate wiring can be set in a range of 1 micrometer to 15 micrometers depending on the requirement of the application. Moreover, in the present invention, the thickness of the gate wiring should be set in a range of 1 micrometer to 10 micrometers from the viewpoint of the high definition and the large screen of the display device and also from the viewpoint of reproducibility and stability of photolithography in manufacturing the insulating polymer film 11. The thickness of the gate wiring should be further preferably set in a range of 2 micrometers to 5 micrometers from the viewpoint of keeping a balance between the high definition and the large screen of the display device and easiness of the manufacturing processes including the process for forming the insulating polymer film 11.

In the present invention, the insulating polymer film 11 and a top end of the gate wiring should be formed in a self-alignment with each other so that the TFT adjacent to the gate wiring is not adversely affected electrically.

An insulating film 14 is deposited on the insulating polymer film 11 and on the top end of the gate wiring. Layers such as the source electrode 15, the drain electrode 16 and an active layer 17 made of material such as P$^+$ a-Si and N$^+$ a-Si are deposited on the insulating film 14. The layers are then patterned, and the respective electrodes are formed by metals or alloys such as Mo, MoW and MoTa to serve as constituent elements of the TFT. Although illustrations for detailed structure of these electrodes are omitted in FIGS. 1(a) and 1(b), any known structure of the electrode can be used in the present invention.

In FIG. 1(a), the gate wiring and the gate electrode, which is a constituent element of the TFT, are formed so as to be adjacent to each other. However, in the present invention, it is possible to form the gate wiring and the gate electrode, which is the constituent element of the TFT, so as to be positionally shifted from each other. In this case, the gate electrode and the gate wiring can be formed so as to be positionally shifted from each other in a horizontal direction on the insulating film 14. Moreover, in the present invention, a size of the gate electrode can be set to any size required for the TFT structure.

In FIG. 1(a), a passivation layer 18 made of an insulating material such as SiOx, SiNy and SiOxNy is formed on the constituent elements of the TFT such as the source electrode 15, the drain electrode 16 and the active layer, that is, a semiconductor layer 17. The passivation layer 18 serves to secure operations of the constituent elements of the TFT.

Contact holes 20a and 20b are formed in the passivation layer 18, and a contact electrode 21a and a signal wiring 21b are connected to the source electrode 15 through the contact hole 20a and the drain electrode 16 through the contact hole 20b, respectively.

FIG. 1(b) shows an embodiment in which the TFT structure of the present invention is applied to the top gate type TFT. The TFT shown in FIG. 1(b) is constituted in such a manner that an insulating layer 22 is formed on the insulating substrate 10, and a source electrode 23, a drain electrode 24, and an active layer 25 are formed on the insulating layer 22, thus constituting the TFT structure. An insulating film 26 made of insulating material such as SiOx, SiNy and SiOxNy is deposited on the constituent elements of the TFT such as the source electrode 23, the drain electrode 24 and the active layer 25 by use of an appropriate method such as a CVD method. Moreover, in the present invention, the insulating layer 22 is optionally used from the viewpoint of characteristics and cost of the TFT.

An insulating polymer film 27 containing the polymer material is formed on the insulating film 26, and a gate wiring 29 is buried and formed in a trench 28 formed in the insulating polymer film 27. As described in FIG. 1(a), description is made for the case where the gate electrode is formed so as to be adjacent to the gate wiring 29 in the embodiment shown in FIG. 1(b). In the present invention, the gate electrode and the gate wiring 29 need not to be formed particularly so as to be adjacent to each other and can be formed so as to be apart from each other in the horizontal direction if necessary.

The gate wiring shown in FIG. 1(b) is also constituted by the plurality of layers such as the seed layer formed by the electroless plating method and the conductive layer formed by the electroplating method. Note that, in the present invention, the gate wiring needs not to be a two-layer structure and can be formed with two or more layers if necessary.

A passivation film 31 is deposited on the insulating polymer film 27, and a contact electrode 32a and a signal wiring 32b are connected to the source electrode 23 and the drain electrode 24 respectively, both through the passivation film 31, the insulating polymer film 27, and the insulating film 26. The same materials and constitutions as those of each of the layers described in FIG. 1(a) can be employed for each of the films described in FIG. 1(b).

FIGS. 2(a) and 2(b) are drawings for explaining in detail operations of the conventional TFT structure and the TFT structure of the present invention. FIG. 2(a) shows the gate wiring of the conventional TFT structure, and FIG. 2(b) shows the gate wiring of the TFT structure of the present invention. As shown in FIG. 2(a), when an attempt is made to increase a cross sectional area of the conventional gate wiring 35, a horizontal planar area of the conventional gate wiring 35 is inevitably expanded due to a film growth rate seen in a film growth method such as sputtering. Even if the cross sectional area of the gate electrode 35 is increased by forming the gate wiring 35 to be thick, disconnection of the wirings and the like formed thereon may occur due to a difference in level resulting from making the gate electrode 35 thick.

It should be understood by those skilled in the art that the gate wiring in the active area (containing the source and drain) is typically referred to as the gate electrode while outside of the active area it is simply referred to as the gate wiring.

In the constitution of the gate wiring in the present invention as shown in FIG. 2(b), the gate wiring 35 is constituted in the trench formed in the insulating polymer film 36 with a high aspect ratio while being self-aligned with the insulating film. The aspect ratio, or the ratio of the height (h) to the width (w), in the present invention is defined as the following equation, in which a height (h) is divided by a width (w).

[Equation 1]

$$\text{Ratio of Height to Width (Aspect Ratio)} = As = h/w \quad (1)$$

More specifically, when considering the case where the cross sectional area of the gate wiring 35 is constant (S1=S2) in FIGS. 2(a) and 2(b), floating capacitance generated between the gate wiring 35 and each layer 37 formed above the gate wiring 35 increases in accordance with a horizontal area of the gate wiring 35. Therefore, though it is possible to reduce resistivity of the gate wiring 35 merely by increasing its cross sectional area, the TFT cannot sufficiently handle a signal delay due to an increase in the floating capacitance. However, since the gate electrode 35 is thickened while keeping the aspect ratio in a certain range in the present invention, if the cross sectional area is constant, the floating capacitance can be reduced at a ratio of Lb/La as shown in FIGS. 2(a) and 2(b). Accordingly, it is possible to further reduce the signal delay by making the aspect ratio As higher.

As shown in FIG. 2(b), the constitution of the gate electrode 35 of the present invention enables the thickness of the gate electrode 35 to be increased while maintaining its characteristics. Accordingly, it is possible to make the cross sectional area of the gate electrode 35 larger and obtain desired characteristics such as a large screen and a high definition of the display device without causing the problem of the signal delay. The aspect ratio (As) of the gate electrode 35 in the present invention should be set in a range from 0.3 to 3 when the thickness of the gate electrode 35 ranges from 2 micrometers to 15 micrometers, to sufficiently achieve the object of the present invention that is a large screen and a high definition of the display device while giving the gate electrode a larger cross sectional area than that of the conventional gate electrode. Furthermore, to achieve low resistivity of the gate electrode 35 for the sake of the object of the present invention that is the large screen and the high definition of the display device, the aspect ratio (As) of the gate electrode 35 should be especially set in a range from 0.4 to 3 when the thickness of the gate electrode 35 ranges from 2 micrometers to 15 micrometers.

FIGS. 3(a) to 3(f) show manufacturing steps of the method of manufacturing the TFT of the present invention. In the method of manufacturing the TFT of the present invention, as shown in FIG. 3(a), the insulating substrate 10 such as glass and ceramics, which has been subjected to a surface treatment if necessary, is prepared. Subsequently, as shown in FIG. 3(b), the substrate 10 is first treated with a silane coupling agent, namely an amino-silane coupling agent, thus forming a Pd-containing catalyst layer 41 for performing electroless plating. The catalyst layer 41 can be formed in such a manner that, for example, the substrate 10 is immersed in a commercially available catalyst aqueous solution containing either Pd ions or Pd colloid, and metals are then separated out by reduction of the Pd ions according to need.

Next, as shown in FIG. 3(c), an insulating polymer film 42 containing polymer is formed on the catalyst layer 41 by use of an appropriate coating method such as a spin coating method, for example. The polymer that can be used here is one of thermoplastic resin and thermosetting resin or photoresist as described in FIG. 1. Particularly, the buried gate wiring can be formed without adding steps of exposure and development, by using one of the photosensitive resin and the photosensitive resin composition as the foregoing polymer material.

Subsequently, as shown in FIG. 3(d), exposure and development are performed for the insulating polymer film 42 made of photoresist by using an appropriate photomask, thus forming a trench 43 for forming the gate wiring. The Pd catalyst is exposed at the bottom of the trench 43, and it is possible to selectively form a seed layer by use of the electroless plating method.

In the present invention, in the case where the insulating polymer film 42 is made of one of thermoplastic resin and thermosetting resin instead of being made of one of the photosensitive resin and the photosensitive resin composition, the trench 43 can be formed by use of a method such as a screen printing method, not by use of the exposure and development processes. By use of the screen printing method, it is also possible to reduce the number of the processes irrespective of whether the insulating polymer film 42 used being one of the photosensitive resin and the photosensitive resin component or being one of the thermoplastic resin and the thermosetting resin.

A step for forming a seed layer 44a in the trench 43 by the electroless plating in the present invention is shown in FIG. 3(e). As conductive material for forming the seed layer 44a to function as a conductive layer, any known metal can be employed. In the present invention, however, it is preferable to form the seed layer 44a using nickel (Ni) by the electroless plating method. When the seed layer 44a is formed by Ni in the present invention, adherability of the seed layer 44a to the substrate 10 made of a metal such as Cu, which is formed relatively thick and to be described later, can be enhanced. It is therefore possible to reduce disadvantages occurring due to detachment of the gate wiring from the substrate 10 as well as warping of the glass substrate, caused by an increase in in-film stress accompanied with the thickening of the insulating polymer film 42.

The above described seed layer 44a can be formed by the electroless plating method by using, for example, a nickel sulfate aqueous solution containing hypophosphorous acid. Any known additives other than nickel sulfate may be added to the aqueous solution for forming the seed layer 44a. A thickness of the seed layer 44a shown in FIG. 3(e) is not particularly limited in the present invention, and the seed layer 44a can be formed to have any thickness as long as no disadvantages, such as the detachment of the gate wiring and the warping of the substrate caused by the formation of the seed layer 44a, occur. As for the electroless plating method for forming the seed layer 44a, any known techniques may be employed.

Next, in the method of manufacturing the TFT structure of the present invention, as shown in FIG. 3(f), a conductive layer 44b formed by a metal with low resistivity such as Al, Cu, and Ag is deposited by the electroplating method, and the gate wiring is formed. When the conductive layer 44b is formed by a metal such as copper (Cu) by applying the electroplating method, the substrate 10 on which the structure shown in FIG. 3(e) is formed is immersed in a copper sulfate ($CuSO_4$) aqueous solution. Thereafter, by allowing current to flow therethrough, a deposition amount of Cu being separated out is controlled by a product of a current amount and duration according to the Faraday's law. Thus it is made possible to form the gate wiring self-aligned with the insulating polymer film 42.

The reason why a gate wiring 45 can be formed in a self-alignment as described above is estimated as follows. Specifically, since the trench 43 is formed in the insulating polymer film 42 in the present invention, when the seed layer 44a is formed in the step shown in FIG. 3(e), the Pd catalyst adheres not only to the bottom but also to the walls of the trench 43 to some degree. Therefore, Cu can be well deposited from the bottom of the trench 43 not only upward along the walls of the trench 43, but also toward the center of the trench 43 from the walls thereof.

Furthermore, not only that conditions for the electroplating such as the current amount and duration are strictly controlled to form the gate wiring in a self-alignment with the insulating polymer film 42, but also that the self-alignment of the gate wiring can be improved by depositing the gate wiring to a height where the gate wiring protrudes from the trench 43 and by applying a surface treatment such as polishing and etching thereafter.

Material such as amorphous Si, $N^+$ a-Si, $P^+$ a-Si, and polycrystalline Si is then deposited to form the gate electrode adjacent to the gate wiring by use of any known methods. As described above, the gate electrode and the gate wiring can be formed so as to be adjacent to each other, or alternatively apart from each other, depending on requirements for the TFT structure.

In the present invention, Ni is particularly used as the seed layer 44a, and Cu is used as the conductive layer 44b, whereby low resistivity in the TFT including a thick film wiring can be achieved without creating the occurrence of the disadvantage caused by the in-film stress, while satisfying the demand for the large screen and the high definition of the display device.

Also, in the present invention, since the insulating polymer film 42 is used and a degree of unification of the gate wiring and the substrate 10 is enhanced by the seed layer 44a, a difference between the in-film stress and an expansion rate can be more absorbed compared to a case where $SiO_2$ is used as the insulating film. Thus, a TFT with a higher reliability can be provided. Moreover, as a result of the enhancement of the degree of unification of the gate wiring and the substrate 10, it is also possible to form the TFT structure on a flexible substrate that has been subjected to a conductive processing, and hence a display device with an improved flexibility can be provided.

Figure 4:
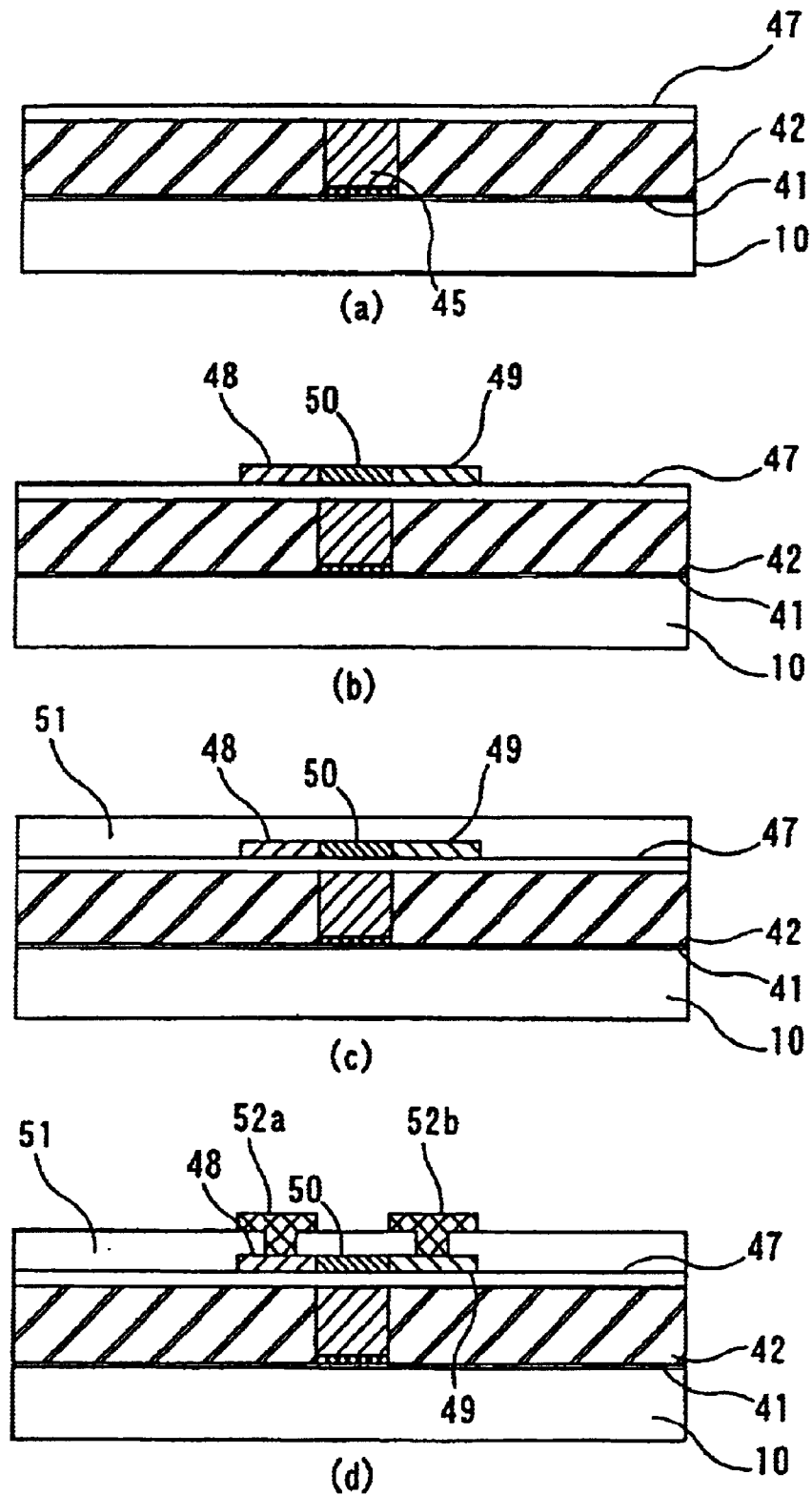
FIGS. 4(a) to 4(d) are drawings showing manufacturing steps subsequent to those shown in FIGS. 3(a) to 3(f) of the method of manufacturing the TFT structure of the present invention.

FIGS. 4(a) to 4(d) are drawings showing manufacturing steps for forming the constituent elements of the TFT of the present invention subsequent to those shown in FIGS. 3(a) to 3(f). After the manufacturing steps shown in FIGS. 3(a) to 3(f), an insulating film 47 made of an insulating layer such as SiOx, SiNy, and SiOxNy is deposited on the insulating polymer film 42, in which the gate wiring and the gate electrode are formed, by use of an appropriate method such as the CVD method, as shown in FIG. 4(a). As shown in FIG. 4(b), a source electrode 48, a drain electrode 49 and an active layer 50 are deposited on the gate insulating film 47 by any known methods including deposition, patterning, and ion-injection. These electrodes are constituted so as to contain an appropriate metal or alloy, which has been subjected to deposition or patterning, such as Mo, MoTa, MoW and Al.

Thereafter, as shown in FIG. 4(c), a passivation layer 51 formed by an insulating layer such as SiOx, SiNx and SiOxNy is deposited, and contact holes are formed in the passivation layer 51 by use of an appropriate patterning process. Then, a contact electrode 52a and a signal wiring 52b are formed in the respective contact holes, thus completing the TFT structure of the present invention shown in FIG. 4(d). As shown in FIGS. 4(a) to 4(d), the TFT structure of the present invention has a constitution that the gate wiring is buried. Therefore, according to the present invention, an unnecessary difference in level is not created upon forming the TFT structure, and hence a reliability of the TFT can be enhanced.

FIGS. 5(a) to 5(e) are manufacturing steps showing another embodiment of a method of manufacturing a TFT structure when the TFT structure of the present invention is applied to a top gate type TFT. When the top gate type TFT structure shown in FIGS. 5(a) to 5(e) is formed according to the method of the present invention, first, the substrate 10 that has been subjected to a proper surface treatment is used as shown in FIG. 5(a). Then, an insulating layer 61 formed by a material such as SiOx, SiNy, and SiOxNy is deposited on the substrate 10 by use of an appropriate method such as the CVD method as shown in FIG. 5(b).

Next, in FIG. 5(c), a source electrode 62, a drain electrode 63 and an active layer 64 are deposited and patterned by use of the same process as described in FIG. 4(b).

Next, as shown in FIG. 5(d), an insulating film 65 is deposited by a method such as the CVD method. After the deposition of the insulating film 65, a Pd catalyst 66 is allowed to adhere to the surface of the insulating film 65 in the same manner as that described in FIG. 3. An insulating polymer film 67 used in the present invention is then formed on the insulating film 65. The above-described manufacturing steps can be performed by use of the same methods as those described in FIG. 3.

Figure 6:
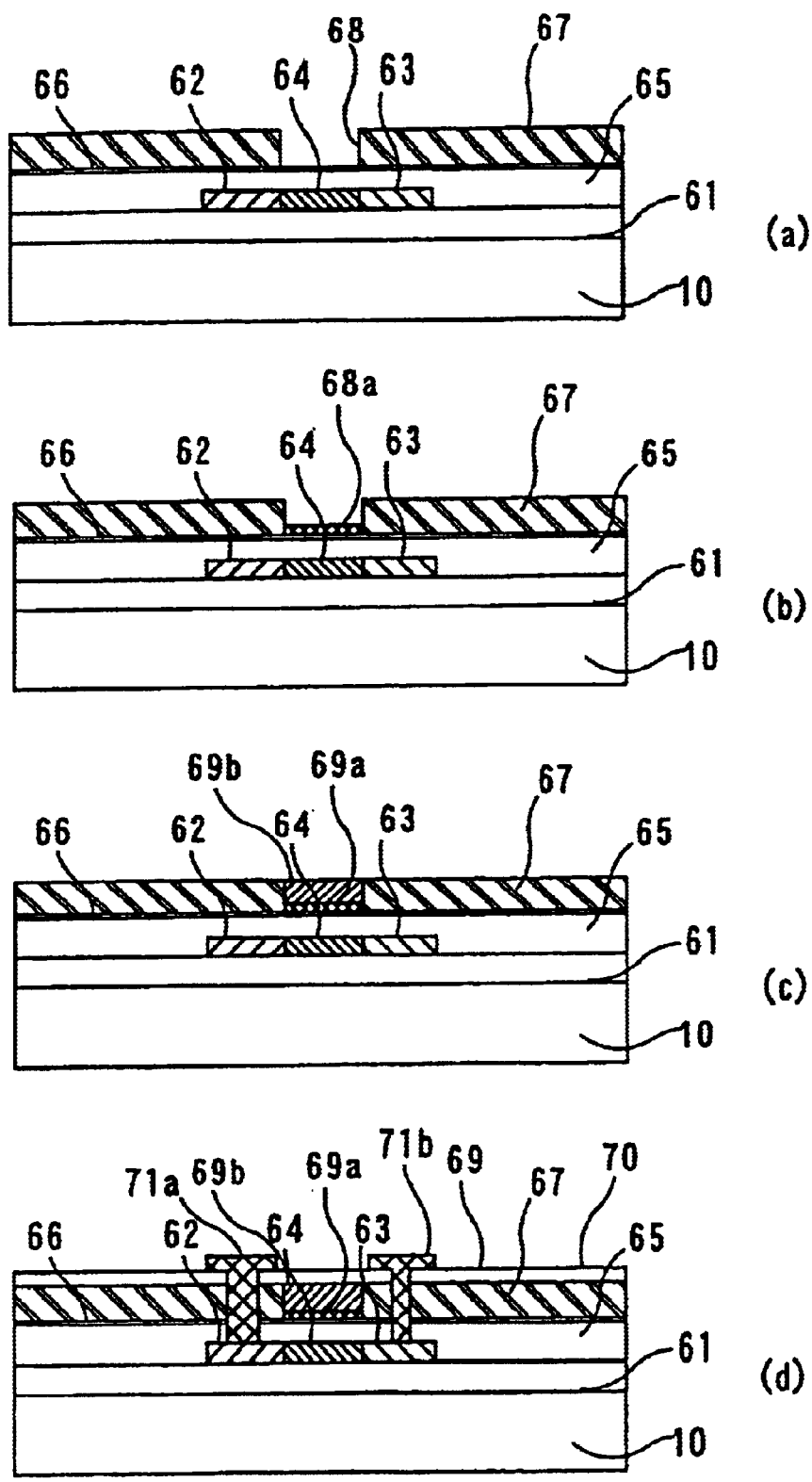
FIGS. 6(a) to 6(d) are drawings showing manufacturing steps subsequent to those shown in FIGS. 5(a) to 5(e) of the method of manufacturing the TFT structure according to the present invention.

In FIGS. 6(a) to 6(d), a trench 68 is formed in the insulating polymer film 67 deposited as shown in FIG. 5(d). A seed layer 69a is then formed by use of the electroless plating method as shown in FIG. 6(b), and a conductive layer 69b is deposited on the seed layer 69a by use of the electroplating method as shown in FIG. 6(c). A passivation layer 70 is formed on the entire surface of the resultant structure, and a contact electrode 71a and a signal wiring 71b are formed in the same manner as those described above, as shown in FIG. 6(d), thus completing the top gate type TFT.

Figure 7:
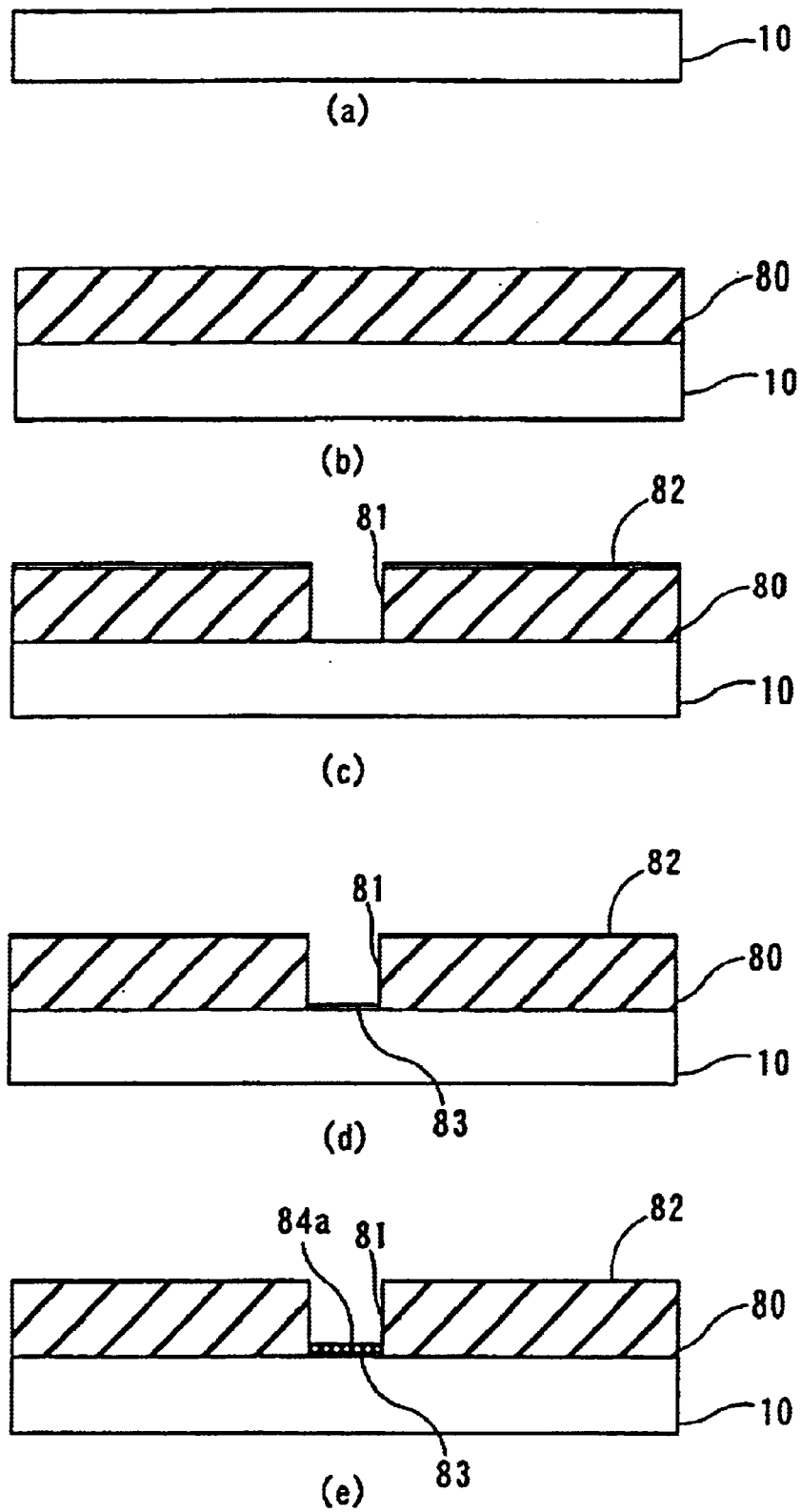
FIGS. 7(a) to 7(e) are drawings showing manufacturing steps of still another embodiment of a method of manufacturing the TFT structure according to the present invention.

FIGS. 7(a) to 7(e) are drawings showing still another embodiment of the method of manufacturing the TFT structure of the present invention. In the method of manufacturing shown in FIGS. 7(a) to 7(e), the substrate 10 that has been subjected to a surface treatment according to necessity is used as shown in FIG. 7(a), and an insulating polymer film 80 is formed on the substrate 10 as shown in FIG. 7(b). In the step shown in FIG. 7(c), a trench 81 is formed by use of the same method as that described in FIG. 3. After the formation of the trench 81, a water repellent layer 82 is transferred or formed by treating the insulating polymer film 80 and the substrate 10 with fluid dispersion obtained by dispersing silicone particles.

Thereafter, the resultant structure shown in FIG. 7(d), in which the insulating polymer film 80 and the water repellent layer 82 are formed on the substrate 10, is immersed in a Pd catalyst aqueous solution, and a treatment with the Pd catalyst is performed for this resultant structure. Pd or Pd colloid adheres to the portion where the water repellent layer 82 is not formed, and the Pd or Pd colloid does not adhere to the portion where the water repellent layer 82 is formed. Therefore, as shown in FIG. 7(e), the seed layer 84a can be well formed by use of the electroless plating method. Thereafter, a conductive layer made of a metal with low resistivity such as Cu is deposited by the electroplating method, thus forming the gate wiring.

In still another embodiment of the method of manufacturing the TFT structure of the present invention, the transfer of the water repellent layer 82 can be performed before the formation of the trench 81 shown FIG. 7(c). Moreover, in the present invention, when the insulating polymer film 80 is formed, silicone-containing polymeric substance containing silicone segments can be used as the polymer. Alternatively, the silicon-containing polymeric substance containing silicone segments, mixed with the above-described polymers, can be used as the polymer. In this case, too, the silicone segments are exposed on the surface of the insulating polymer film 80.

When the above-described silicone-containing polymeric substance is used, a water repellent effect obtained by transferring the water repellent layer 82 by use of another step can also be obtained, and it is possible to selectively adhere the Pd catalyst. Furthermore, the polymer containing the foregoing silicone segments or the polymer composition can be formed as photosensitive resin or photosensitive resin composition.

In the embodiments of the TFT structure of the present invention, after the insulating polymer film described in FIGS. 3 and 5 in detail is formed, various kinds of treatments can be performed to adjust optical properties of the insulating polymer film.

Figure 9:
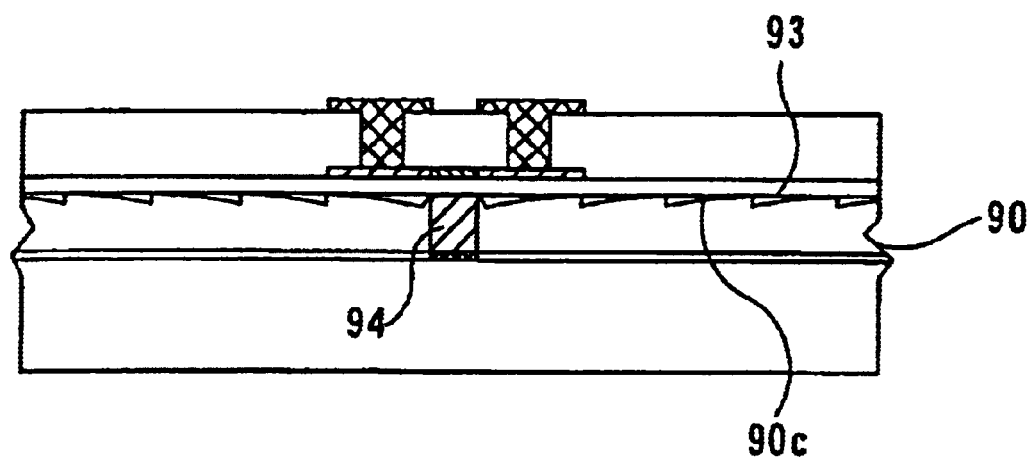
FIG. 9 is a drawing showing further still another embodiment of the TFT structure according to the present invention.

FIGS. 8(a) and 8(b) and FIG. 9 are drawings showing the embodiment of the TFT structure in which the treatment is performed for the foregoing insulating polymer film of a bottom gate type TFT structure. In the embodiment of the TFT structure shown in FIG. 8(a), a surface of an insulating polymer film 90 is subjected to a surface roughing treatment by use of, for example, a proper photolithography process, and a reflection film 90a is formed on the surface of the insulating polymer film 90 that has been subjected to the surface roughing treatment. Thus, the TFT structure is constituted so as to make a visual field angle wider. For the reflection film 90a, a reflection film made of any known material and constitution formed by, for example, the CVD process using various materials, can be used. The reflection film 90a can be formed as one layer structure, or a multi-layered structure composed of dielectric.

Moreover, in the embodiment of the TFT structure shown in FIG. 8(a), an insulating film 91 for flattening the entire surface of the resultant structure is formed on the surface that has been subjected to the surface roughing treatment, thus achieving a structure with no adverse influences on the constituent elements of the TFT. For the insulating film 91 for flattening, the same material as that constituting the insulating polymer film 90 can be used, or alternatively the insulating film 91 can be constituted by laminating material having different refractive index so as to create a scattering effect.

FIG. 8(b) shows still another embodiment of the TFT structure of the present invention. In the embodiment of the TFT shown in FIG. 8(b), a slope 90b is formed on the insulating polymer film 90, so as to form a prism. A polymer layer 92 having a still different refractive index is laminated on the insulating polymer film 90, thus constituting the prism. Accordingly, it is possible to achieve an enhanced visual field angle and high luminance even when the TFT structure having the structure shown in FIG. 8(b) is used.

In the TFT structure shown in FIG. 9, a Fresnel lens 90c is formed on the surface of the insulating polymer film 90, and another insulating material 93 having a further different refractive index is formed to create a flat surface on the Fresnel lens 90c, thus controlling a directivity of a beam of light. Although a polymer material can be used as the insulating material 93 similarly in the cases of the insulating films 91 and 92, dielectric other than polymer can also be used if necessary. In the TFT structure shown in FIGS. 8 and 9, the insulating polymer film 90 and a gate wiring 94 are formed so as to be self-aligned with each other in an adjacent portion in any case, and are formed not to have adverse influences on the constituent elements of the TFT formed above.

Figure 10:
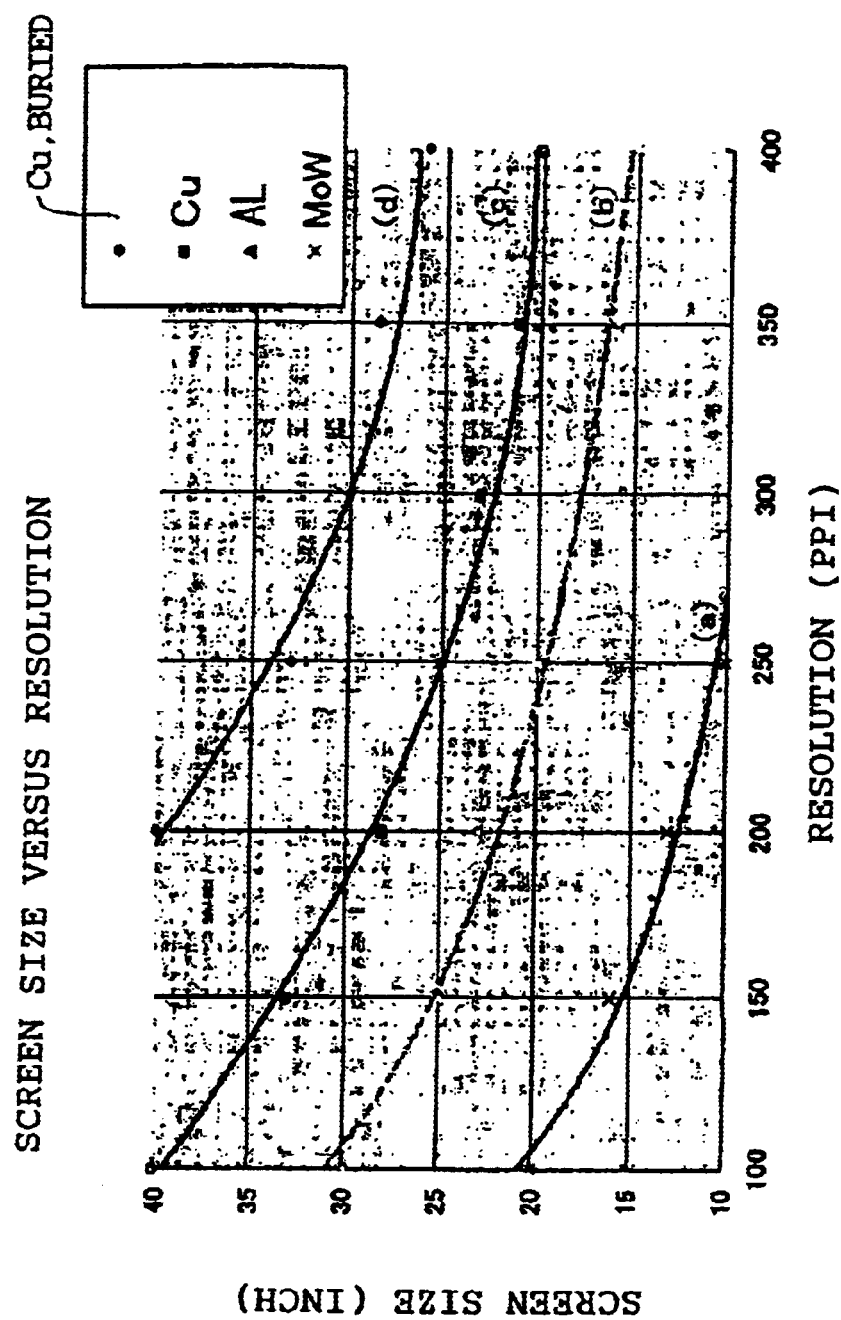
FIG. 10 is a graph in which a screen size (inch) and a resolution (PPI) are plotted for the embodiment of the TFT structure of the present invention.

FIG. 10 is a graph in which a screen size (inch) and a resolution (PPI) in the embodiment of the TFT of the present invention shown in FIG. 2 are plotted. In FIG. 10, the lines (a), (b), and © are for the gate wiring formed by the conventional method, and the line (d) is for the buried gate wiring of the present invention. As shown in FIG. 10, it is indicated that, in all cases, the screen size becomes smaller due to the signal delay caused by an increase of resistivity as the gate wiring becomes thinner in an attempt to enhance the resolution.

In the case where the constitution of the conventional gate wiring is adopted, if it is attempted to achieve a resolution of 400 PPI, the screen size becomes smaller to about 20 inches even when the gate wiring using Cu having the lowest resistivity is adopted, as shown in FIG. 10. Therefore, it is shown that there is a trade-off relationship between the high definition of the display device and the large screen of the same.

However, in the TFT structure constituted by adopting the constitution of the buried gate wiring according to the present invention, since the cross sectional area of the gate wiring can be increased as shown in FIG. 10(d) and the problem of the floating capacitance does not occur, it is possible to provide a screen size of about 25 inches while maintaining a high definition resolution of 400 PPI. This tendency is apparent when compared with the case of the lower resolution, and it is indicated that the display device using the TFT structure adopting the gate wiring of the present invention can achieve a larger screen compared with that of the conventional display device.

Figure 11:
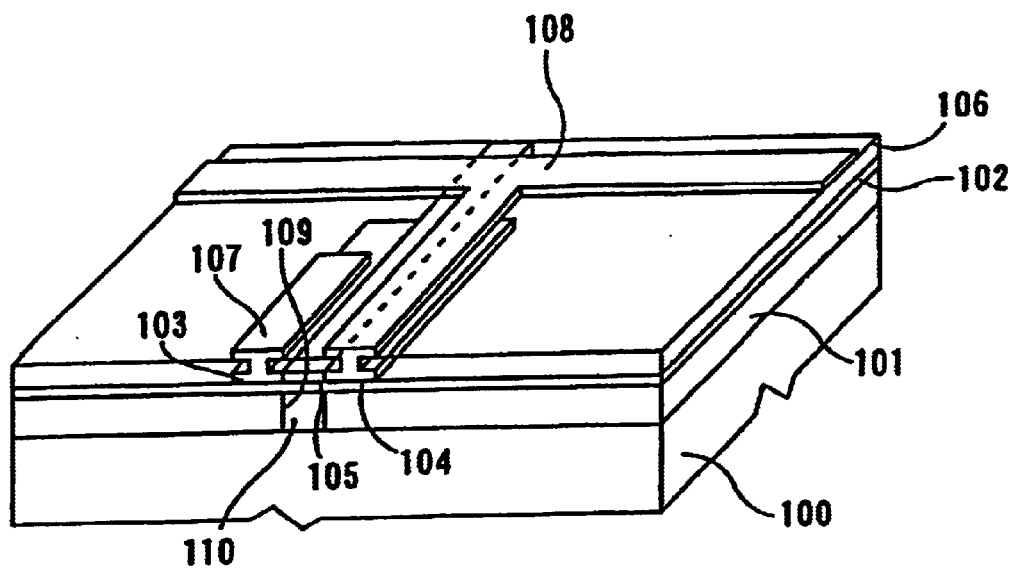
FIG. 11 is a perspective view showing a TFT array used in a display device employing the TFT structure of an embodiment according to the present invention.

FIG. 11 is a perspective view showing a display device in which a TFT array is constituted by use of the TFT structure of the present invention. The TFT array shown in FIG. 11 is constituted as the bottom gate type TFT, and the TFT array is constituted by including an insulating polymer film 101 formed on an insulating substrate 100 and an insulating film 102 deposited on the insulating polymer film 101.

Moreover, in the TFT structure shown in FIG. 11, a source electrode 103, a drain electrode 104 and an active layer 105 are formed on the insulating film 102 after being patterned. A passivation film 106 covers these constituent elements of the TFT to protect them. Moreover, in the TFT structure shown in FIG. 11, a contact electrode 107 and a signal wiring 108 are connected to the source electrode 103 and the drain electrode 104, respectively, through contact holes penetrating through the passivation film 106, and the above described constituent elements are arranged in a form of an array.

As shown in FIG. 11, furthermore, a gate wiring 110 is constituted by depositing a plurality of conductive layers inside a trench 109 formed in the insulating polymer film 101 by the method of the present invention, and is buried therein. In the TFT structure of the present invention, as shown in FIG. 11, it is possible to make the cross sectional area of the gate wiring 110 larger than that of the conventional gate wiring. Furthermore, in the present invention, the gate wiring 110 having the large cross sectional area is buried in the insulating polymer film 101, and the gate wiring 110 is tightly united with the insulating polymer film 101 by use of the electroless plating and the electroplating. Accordingly, disadvantages such as detachment, warping, and cracking of the gate wiring 110 due to residual in-film stress do not occur, and it is possible to achieve a large screen and a high definition of a display device while securing a reliability of the TFT.

Figure 12:
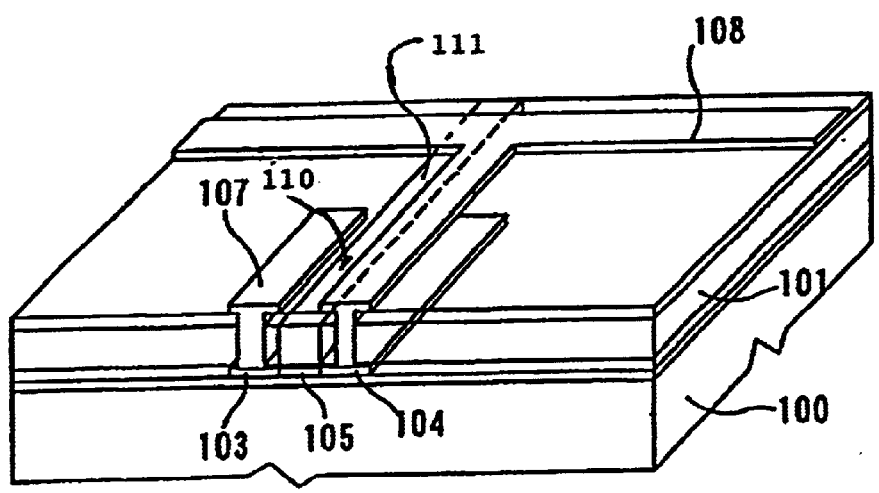
FIG. 12 is a perspective view showing a TFT array used in a display device employing the TFT structure of another embodiment according to the present invention.

FIG. 12 is a drawing showing a TFT array in the case where the TFT structure of the present invention is applied to the top gate type TFT. Similarly to the descriptions made in FIG. 11, the gate wiring 110 is formed by being buried in a trench formed in the insulating polymer film 101. Accordingly, it is possible to increase the cross sectional area of the gate electrode without causing disadvantages such as disconnection of wirings formed thereon. As noted earlier, the gate wiring 110 in the active area is referred to as the gate electrode while the gate wiring 111 outside of the active area is referred to as the gate wiring.

The TFT structure of the present invention can be employed in any display devices using a so-called active matrix driving system in which the TFTs are arranged in a form of an array as described above. For such a display device, a liquid crystal display device and an electroluminessence device using an inorganic or organic activation material can be listed as examples.

Although the present invention was described accompanied with the embodiments shown in the drawings, the present invention is not limited to the embodiments shown in the drawings, and any known material, constitution and dimension in various constituent factors such as a constitution, a material and a dimension, can be employed as long as these constituent factors demonstrate the effects of the present invention.

Although the preferred embodiments of the present invention have been described in detail, it should be understood that various changes, substitutions and alternations can be made therein without departing from spirit and scope of the inventions as defined by the appended claims.

What is claimed is:

1. A thin film transistor structure comprising a substrate, and formed on the substrate a source electrode; a drain electrode; a gate electrode; an active layer; a gate wiring connected to the gate electrode; and an insulating polymer film in which at least a trench is formed, wherein said trench formed in said insulating polymer film accommodates said gate wiring constituted of a conductive layer, so that said gate wiring is self-aligned with said insulating polymer film wherein the gate wiring and insulating polymer film have a thickness which is the same for both the gate wiring and insulating polymer film so that the gate wiring is set to the same level as the insulating polymer film.

2. The thin film transistor structure according to claim 1, wherein a thickness of said gate wiring is set to 2 micrometers to 15 micrometers, and an aspect ratio of said gate wiring ranges from 0.3 to 3.

3. The thin film transistor structure according to claim 1, wherein said insulating polymer film is subjected to a treatment for adjusting an optical property thereof.

4. The thin film transistor structure according to claim 1, wherein said insulating polymer film includes a plurality of polymers.

5. The thin film transistor structure according to claim 1, wherein said insulating polymer film includes a silicone-containing polymeric substance.

6. The thin film transistor structure according to claim 1, wherein said gate wiring is constituted of the conductive layer comprising a palladium seed layer and a thicker metal layer wherein the metal is selected from the group consisting of copper, aluminum and silver.

7. The thin film transistor structure according to claim 1, wherein said thin film transistor is constituted as a bottom gate type thin film transistor or a top gate type thin film transistor.

8. The thin film transistor structure according to claim 1, wherein said insulating polymer film comprises photosensitivity resin or photosensitive resin composition.

9. A display device including a thin film transistor structure comprising a substrate, and formed on the substrate a source electrode; a drain electrode; a gate electrode; an active layer; a gate wiring connected to said gate electrode; and an insulating polymer film in which at least a trench is formed, and said trench formed in said insulating polymer film accommodates said gate wiring constituted of a conductive layer so that said gate wiring is self-aligned with said insulating polymer film wherein the gate wiring and insulating polymer film have a thickness which is the same for both the gate wiring and insulating polymer film so that the gate wiring is set to the same level as the insulating polymer film.

10. The display device according to claim 9, wherein a thickness of said gate wiring is set to 2 micrometers to 15 micrometers, and an aspect ratio of said gate electrode ranges from 0.3 to 3.

11. The display device according to claim 9, wherein said insulating polymer film is subjected to a treatment for adjusting an optical property thereof.

12. The display device according to claim 9, wherein said insulating polymer film contains photosensitive resin or photosensitive resin composition.

13. The display device according to claim 9, wherein said insulating polymer film contains a silicone-containing polymeric substance.

* * * * *